United States Patent [19]
Tsurishima et al.

[11] Patent Number: 5,227,717
[45] Date of Patent: Jul. 13, 1993

[54] CONTACT ASSEMBLY FOR AUTOMATIC TEST HANDLER

[75] Inventors: Kazuyuki Tsurishima; Minoru Baba; Teruaki Sakurada, all of Kitasaitama, Japan; Theodore C. Guenther, San Diego, Calif.

[73] Assignees: Sym-Tek Systems, Inc., San Diego, Calif.; Advantest Corp., Tokyo, Japan

[21] Appl. No.: 801,056

[22] Filed: Dec. 3, 1991

[51] Int. Cl.⁵ .............................................. G01R 31/28
[52] U.S. Cl. .................... 324/158 F; 324/158 P; 414/222
[58] Field of Search ............. 324/158 F, 158 P, 72.5, 324/158 R; 414/222, 223, 224; 209/573; 439/912

[56] References Cited

U.S. PATENT DOCUMENTS

| | | | |
|---|---|---|---|
| 3,391,383 | 7/1968 | Antes | 324/158 F |
| 3,408,565 | 10/1968 | Frick et al. | 324/158 F |
| 4,000,798 | 1/1977 | Cedrone | 193/40 |
| 4,124,132 | 11/1978 | Pennings | 404/403 |
| 4,370,011 | 1/1983 | Suzuki et al. | 439/912 |
| 4,410,227 | 10/1983 | Prunella et al. | 209/573 |
| 4,506,213 | 3/1985 | O'Connor | 324/158 F |
| 4,836,797 | 6/1989 | Riechelmann | 439/264 |
| 4,839,587 | 6/1989 | Flatley et al. | 324/158 P |
| 4,866,374 | 9/1989 | Cedrone | 324/158 F |
| 4,926,118 | 5/1990 | O'Connor | 209/573 |

Primary Examiner—Vinh Nguyen
Attorney, Agent, or Firm—Knobbe, Martens, Olson & Bear

[57] ABSTRACT

A contact assembly for use in testing electronic devices such as integrated circuits (IC's) and the like. The contact assembly has a test fixture having a test contactor, a corresponding carrier module aligned on a test tray for positioning the electronic devices to be tested in alignment with the test fixture, and a vertical drive for driving the carrier module to meet with the test contactor. The vertical drive is provided with an individual drive for giving an additional contact force to said carrier module and said test contactor. The vertical drive further includes a lead pusher for ensuring ideal contact pressure for the leads of the electric devices with the test contactor. The carrier module is provided with a plurality of slits for separating the leads of the electric devices and inviting the test contactor.

9 Claims, 12 Drawing Sheets

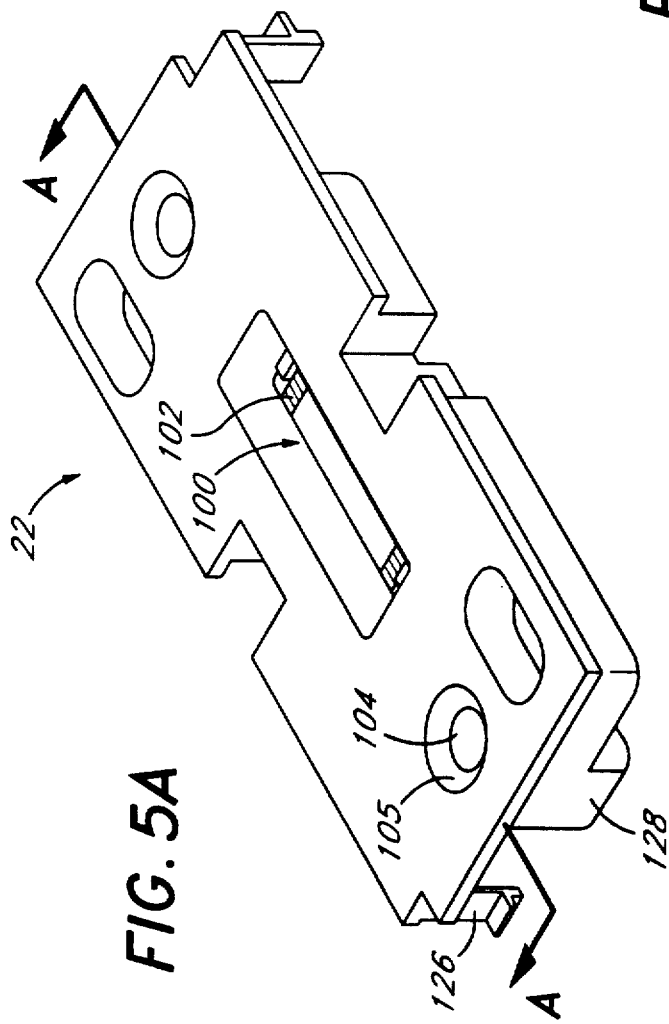
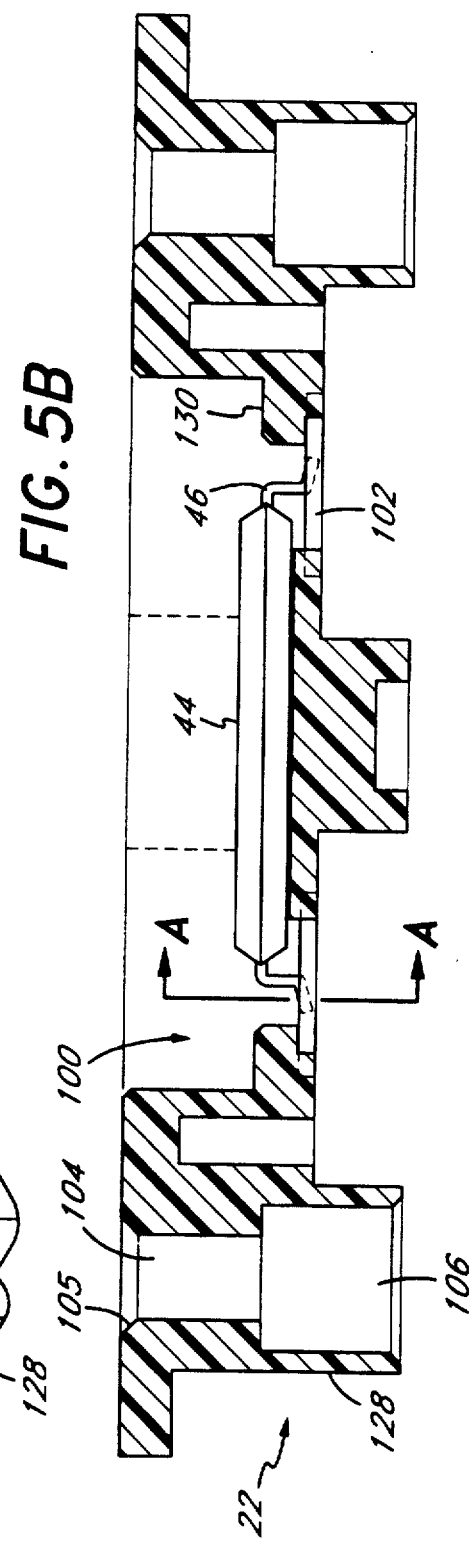
FIG. 5A
FIG. 5B

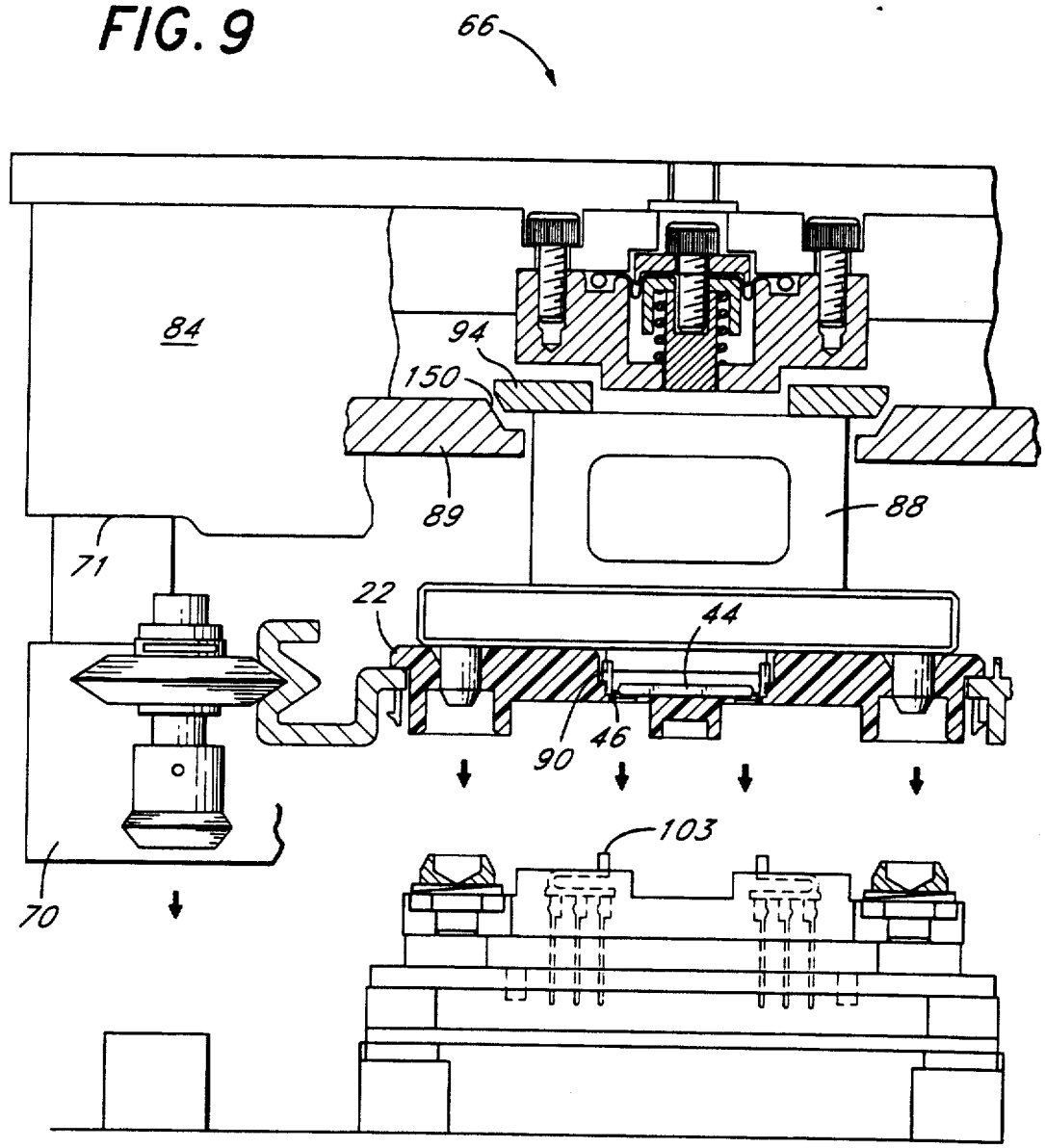

FIG. II
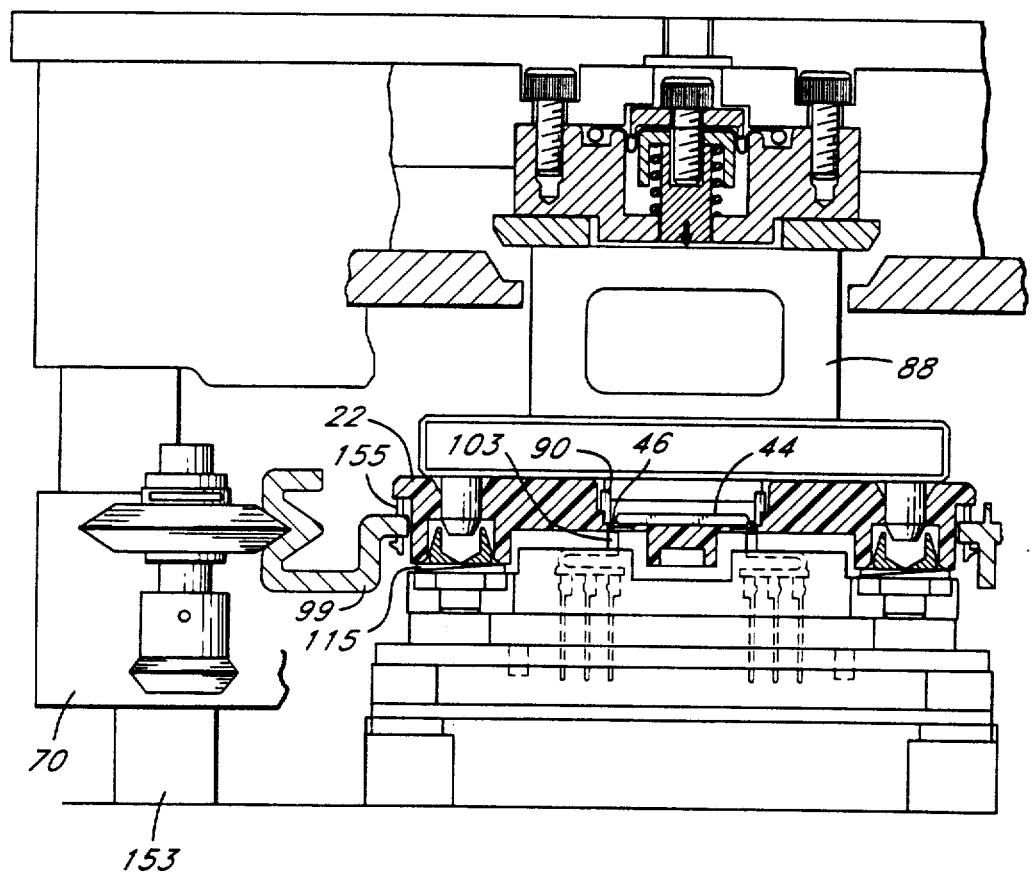

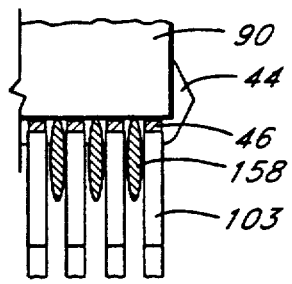
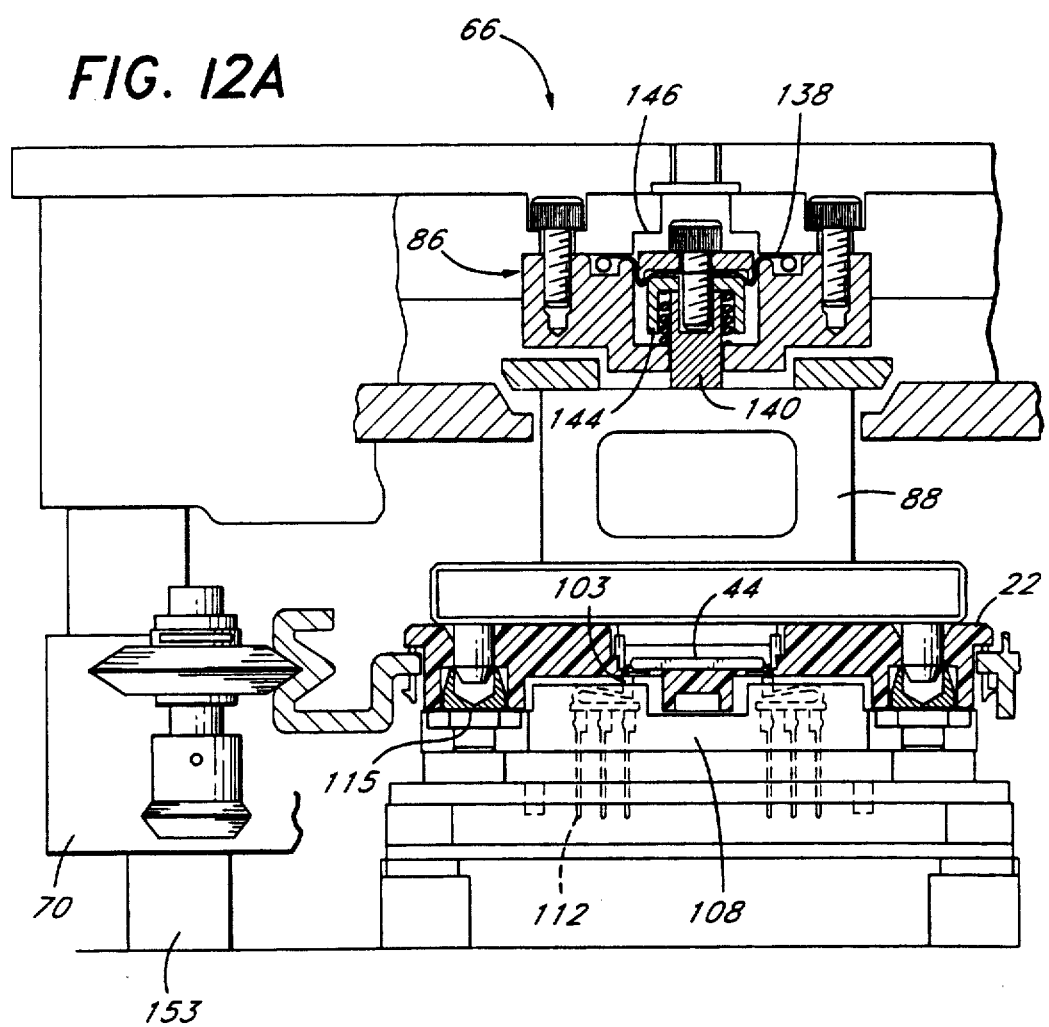

CONTACT ASSEMBLY FOR AUTOMATIC TEST HANDLER

FIELD OF THE INVENTION

This invention relates to a contact assembly for testing electronic devices such as integrated circuits ("ICs"), semiconductor chips, and the like, and more particularly, to an electronic device contact assembly for improving the productivity and reliability of a test head contact mechanism used in an automatic test handler using a test tray for mounting the electronic devices to be tested.

BACKGROUND OF THE INVENTION

In the electronics industry, there is a constant demand for electronic devices, such as integrated circuits ("ICs") or semiconductor chips, to be produced less expensively and in smaller dimensions while simultaneously increasing the density of electronic functions within the devices. One way to increase productivity of such electronic devices, and thereby reduce their unit cost, is to increase the test speed of the devices by testing a plurality of them at the same time.

It has become a test technology standard to place a number of electronic devices to be tested on a test tray and position them so as to be engaged by a test head plate having a number of corresponding test contactors. One device is placed on a seat of a carrier module, and each carrier module is provided with one or more device seats. A number of modules are then positioned in both columns and rows on a test tray. The test tray having a number of carrier modules is arranged so as to be in vertical alignment (either above or below) with a test fixture. The test fixture includes test contactors (test pins) for contact with pins of each device to be tested for supplying and receiving the test signals from the device. Each module is aligned with a corresponding test contactor so that when either the test tray or the test fixture are moved in a vertical direction toward the other, the contactor engages the electronic device positioned within the carrier module.

The contactor is provided with a number of test pins or leads which come into electrical communication with the leads of the electronic devices to be tested. The automatic test handler is electrically connected to a electronic device test system, for example, an IC tester which includes a test signal generator for supplying a test signal to the device, and with a signal comparator for analyzing the results of the test. Based on such results, the electronic devices are transferred to another location in the test process and sorted for proper handling.

Thus, in order to increase the volume of electronic devices that can be tested in the manner described above during a given period of time, it is desirable to maximize the efficiency of the contact test assembly, including primarily the test contactor and the carrier containing the electronic devices. However, such standard electronic device test systems described above suffer from a number of disadvantages. First, it is difficult to accurately layout and position the device to be tested with respect to the contactors in the test fixture for engaging the electric leads of the devices. As a result, a problem arises in that an electrical contact between the leads of the device and the contactor is not perfect. It is especially true when an electronic device to be tested becomes small and a spacing between the leads of the device becomes small. Further, when a large number of electronic device to be tested are arranged on the test tray, the positioning error in one unit of the device will increase by the multiple of the number of the devices aligned on the tray and thus cause a serious misconnection problem.

Secondly, even if the large number of devices to be tested are aligned accurately on the test tray, the accuracy of positioning may be degraded because of a small deformation or curvature in the test tray caused by uneven thermal expansion or contraction from immersion in a temperature regulated test chamber. Such test chambers are commonly used to simulate particular device operating temperatures. In that situation, the distance from the contactor to the corresponding device to be tested may change and, as a result, the electrical connection for some devices will be imperfect due to the lack of sufficient proximity between the contactor leads and the device leads, while some other devices will mate with the contactor leads too tightly. Thus, there exists a problem with using large trays in order to increase the number of devices simultaneously tested in the test handler and, therefore, the number of electronic devices that can be tested at one time is currently limited.

Third, for improving the high frequency performance and increasing the device function density, the spacing between the leads of the recent electronic devices to be tested is getting smaller and smaller, and as a result, the leads are becoming thinner. At the same time, the length of the leads is getting shorter. In testing these smaller electronic devices in a test handler, it is sometimes difficult to firmly contact the leads of the devices with the contactor leads, since both leads are not physically strong enough to sustain the firm contact force between them, and are prone to breakage.

Additionally, the size and configuration of standard electronic chips are rapidly changing. Some of the high speed ICs have very short signal leads, instead of the relatively longer leads used in the conventional dual in-line-package ("DIP") type. For example, the newest type of IC device is molded in a package called a TSOP (Thin Small Outline Package), which will be described in more detail later. When utilizing a test tray to test such IC devices, it is necessary to employ a new carrier module to secure an electrical isolation between the leads and also to eliminate the deformation of the leads of the IC devices.

Thus, there s a serious need in the electronic device test industry for a contact assembly which can overcome the problems described above.

SUMMARY OF THE INVENTION

The present invention comprises an improved contact assembly for an automatic test handler which can therefore be used to test substantially increased volumes of such devices during a given time.

The contact assembly comprises a test tray having one or more IC carrier modules which can securely retain chips of various configurations, a vertical drive having a pusher arrangement for pushing the carrier module downward, and a test contactor for supplying and receiving test signals. The contact assembly of the present invention can efficiently make electrical contact between the test contactors in the test fixture and the leads of modern IC's by utilizing a pusher assembly and a carrier module. This arrangement is not mechanically complicated and allows for substantially increased test density.

The pusher arrangement of the present invention is flexibly arranged in the vertical drive so that it can movable within a limited range. Because the pusher is flexibly assembled or is "floating", positioning and engagement with respect to the carrier module can be easily made when the vertical drive descends and meets with the test tray. The pusher arrangement also includes a lead pusher which is made from insulating materials such as sapphire for pushing the electric leads of the IC device to be tested so that the leads realize sufficient contact with the test contactor of the test fixture.

The carrier modules of the present invention are loosely assembled on the test tray for easy horizontal positioning with the pusher arrangement and at the same time capable of adjusting vertically when engaged with the pusher. The combined pair of the carrier module and the pusher becomes floating state when it makes a contact with the test contactor so that it can adjust the position to be ready for insertion of test contactor into carrier module.

The vertical drive is also provided with a plurality of individual drives corresponding to each of the carrier modules for independently pushing the carrier module so that the device in the carrier m can perfectly contact with the contactor leads. The individual pusher overcomes the fluctuations of spacing between the leads of the device and the contactor due to the curvature of the tray or the degradation of flatness of the test fixture by independently provides additional stroke to the carrier.

The carrier module of the present invention includes a plurality of slits on the floor of-..-the seat to allow the contactor leads to come in from the bottom of the module to meet with the leads of the device to be tested. The slit in the carrier module also works as an electrical isolator for the device leads. This structure of the carrier module specifically preferable to the newer IC package called TSOP since the spacing between the leads is extremely small and the leads are very thin.

Thus, the contact assembly for the automatic test handler of the present invention provides a unique combination of a vertical drive having a pusher and a individual vertical drive and a test tray flexibly aligning a large number of carrier modules and a test fixture having a test contactor. In accordance with the present invention, the contact assembly provides an improved mechanism that can quickly and efficiently test a large number of electronic devices simultaneously.

BRIEF DESCRIPTION OF THE DRAWINGS

FIG. 5A is a perspective view of one example of a carrier module of the present invention including a seat and slits for the leads of the device.

FIG. 5B is a cross sectional view of the carrier module along the line A—A of FIG. 5A including an electronic device to be tested in the seat of the carrier module.

FIG. 9 is a partial sectional view of the contact assembly of the present invention showing the process of the contact mechanism, wherein the pusher and the carrier module are in a floating state by the further vertical advancement of the vertical drive from that of FIG. 8A.

FIG. 11 is a partial sectional view of the contact assembly of the present invention showing the process of the contact mechanism, wherein vertical movement of the vertical driver has come to an end after further vertical movement from the FIG. 10A.

FIG. 12A is a partial sectional view of the contact assembly of the present invention showing the final stage of the process of the contact mechanism, wherein an individual vertical drive provides an additional vertical movement to the carrier module to realize the complete connection of the device leads and the contactor leads.

FIG. 12B is a cross sectional view showing the positional relationship between the device leads, the slits in the carrier module, the lead pusher and the test contactor at the final state of the contact procedure of FIG. 12A taken along line A—A of FIG. 5B.

DETAILED DESCRIPTION OF THE INVENTION

Figure 1:
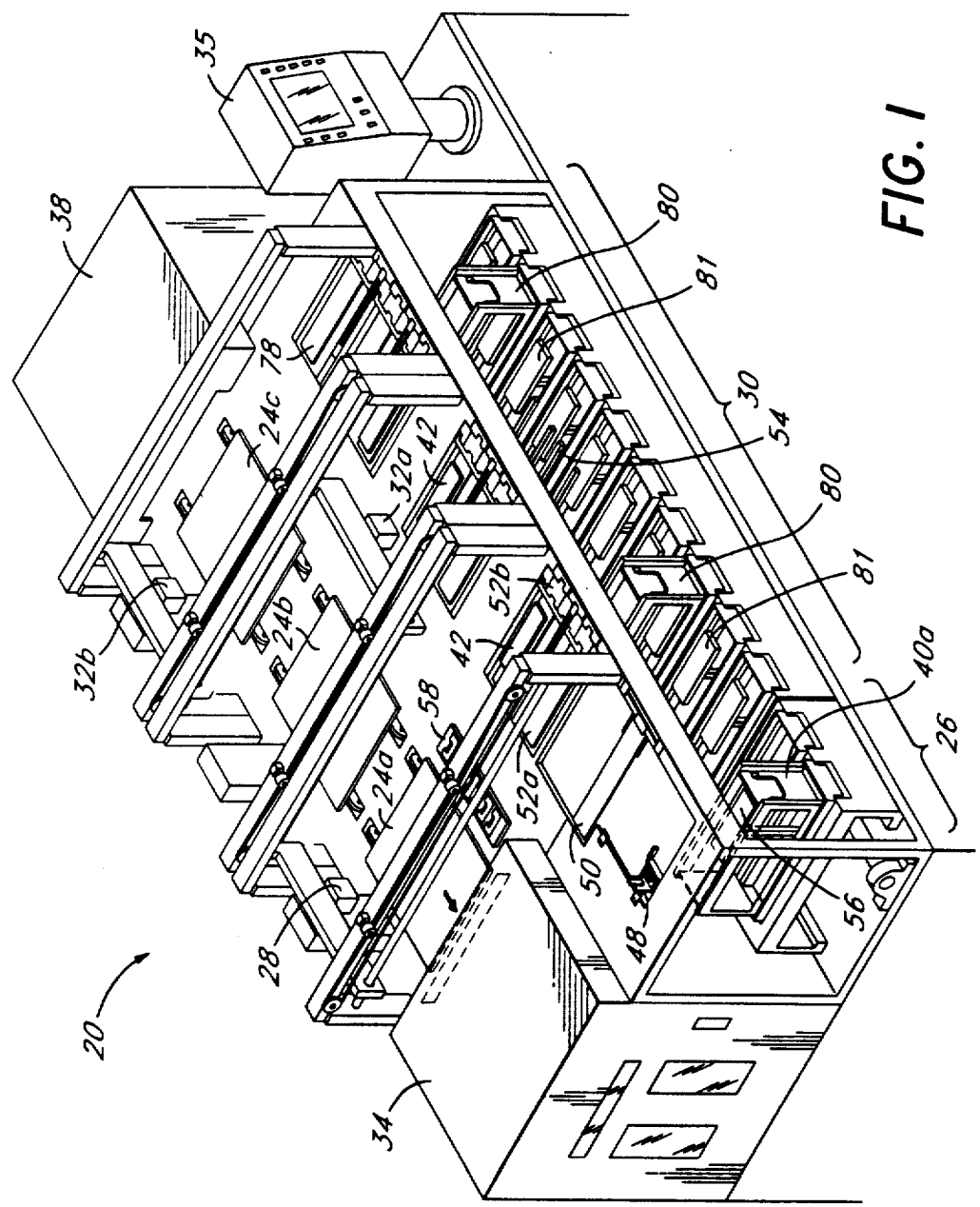
FIG. 1 is a perspective view of an automatic test handler which includes a contact assembly mechanism in accordance with the present invention.

To facilitate a better understanding of the present invention, the description will be given regarding a new automatic test handler wherein the present invention will be employed, however, it should be understood that a contact assembly of the present invention may be employed in a wide variety of automatic test handler. FIG. 1 illustrates generally an automatic test handler 20 utilizing a contact assembly and test trays in accordance with the present invention. A rear view of the test handler of FIG. 1 is illustrated in FIG. 2

Automatic Test Handler

Figure 6:
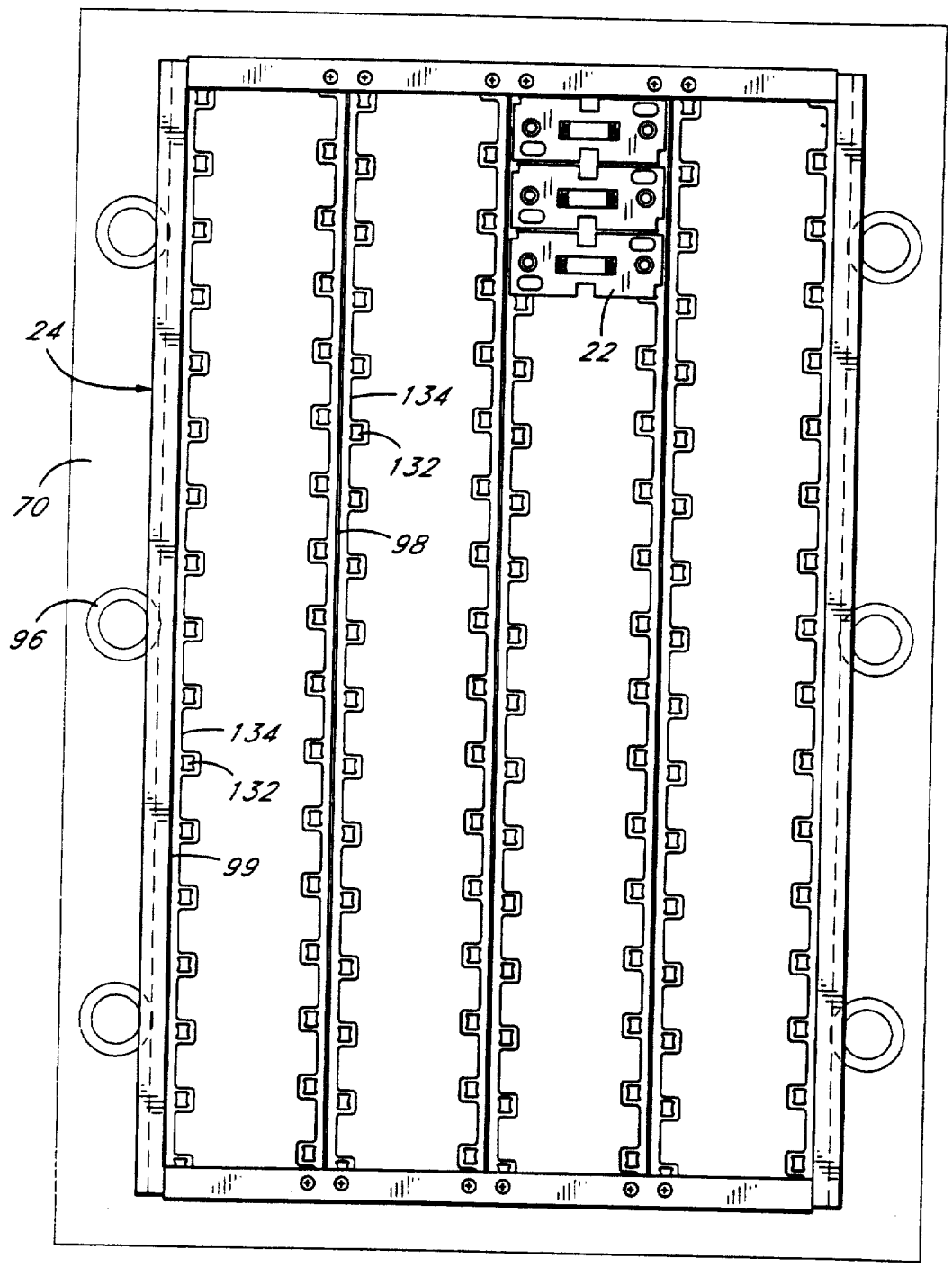
FIG. 6 is a plan view of an example of the test tray of FIG. 4 including the carrier modules of FIGS. 5A and 5B in accordance with the present invention. The test tray is supported by the tray guide and transfer which is illustrated in more detail in FIG. 7A.

Some electronic devices, for example, the newest type of IC memory chips, are packed in trays ("customer trays") by manufacturers of the devices and for sale in the market. The shape and size of the customer trays vary from manufacturer to manufacturer. In the test handler 20 of FIG. 1, the electronic devices to be tested are first transferred from the customer tray to carrier modules within a test tray to facilitate operation of the test handler 20. A typical carrier module and test tray are shown in FIGS. 5 and 6 and will be described in more detail below. Essentially, a number of test trays containing electronic devices are processed through the test handler 20 of FIG. 1 in a stage-by-stage manner in order to test the electronic devices for defects. The focus of the present invention is in the test head stage where the contact assembly is located.

Figure 2:
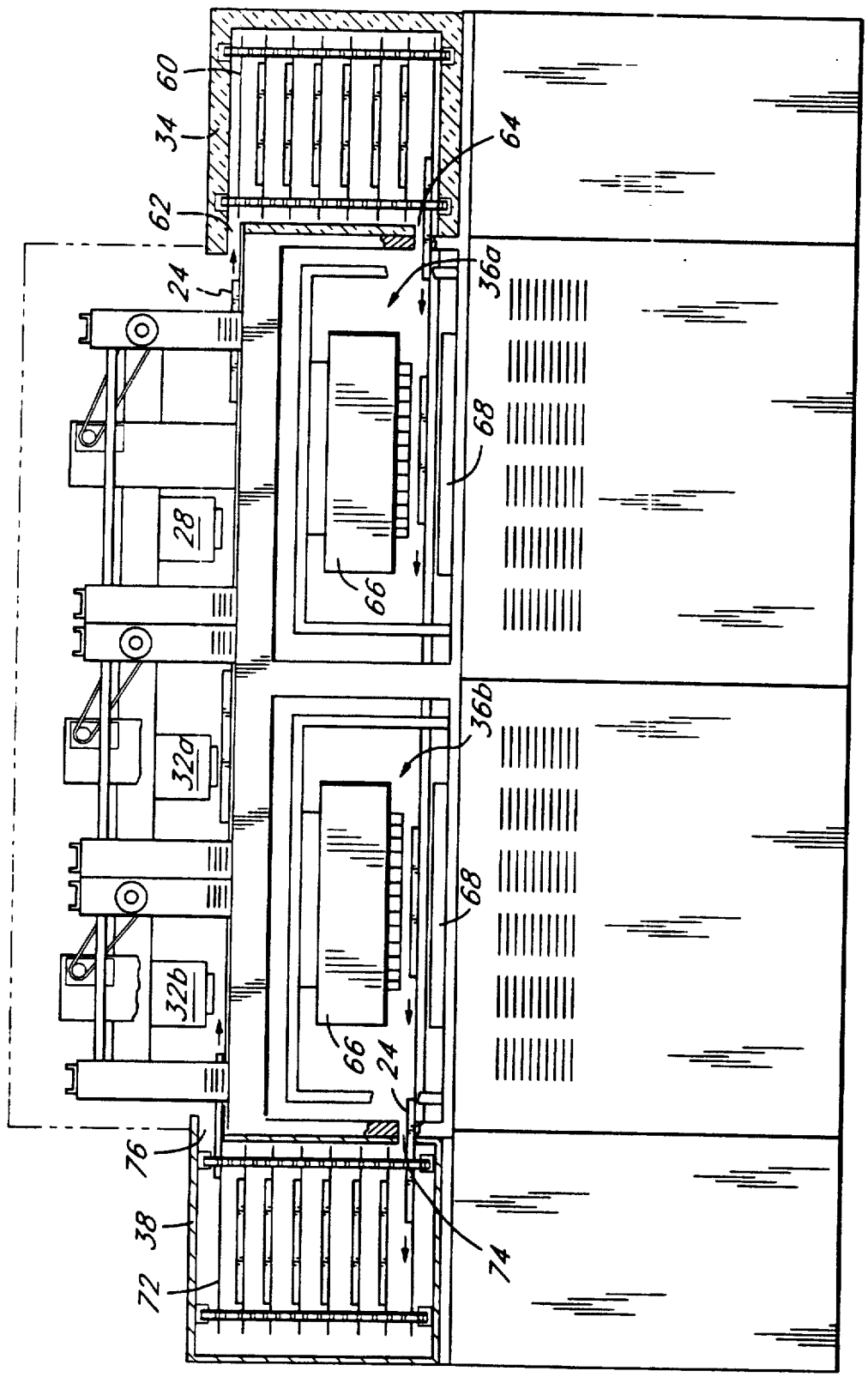
FIG. 2 is a rear view of the automatic test handler of FIG. 1 illustrating a soak chamber, an unsoak chamber and two test heads. The contact assembly of the present invention is incorporated in the test head.

The electronic device test system of FIGS. 1 and 2 is comprised of a loader 26, a load pick and place 28, an unloader 30, a soak chamber 34, test heads 36a and 36b, an unsoak chamber 38 and two sort pick and place devices 32a,b. The test handler 20 of FIG. 1 also includes an operator console 35, a control module and an electronic module (not shown) for interfacing with a test system, for example an IC tester.

Figure 3:
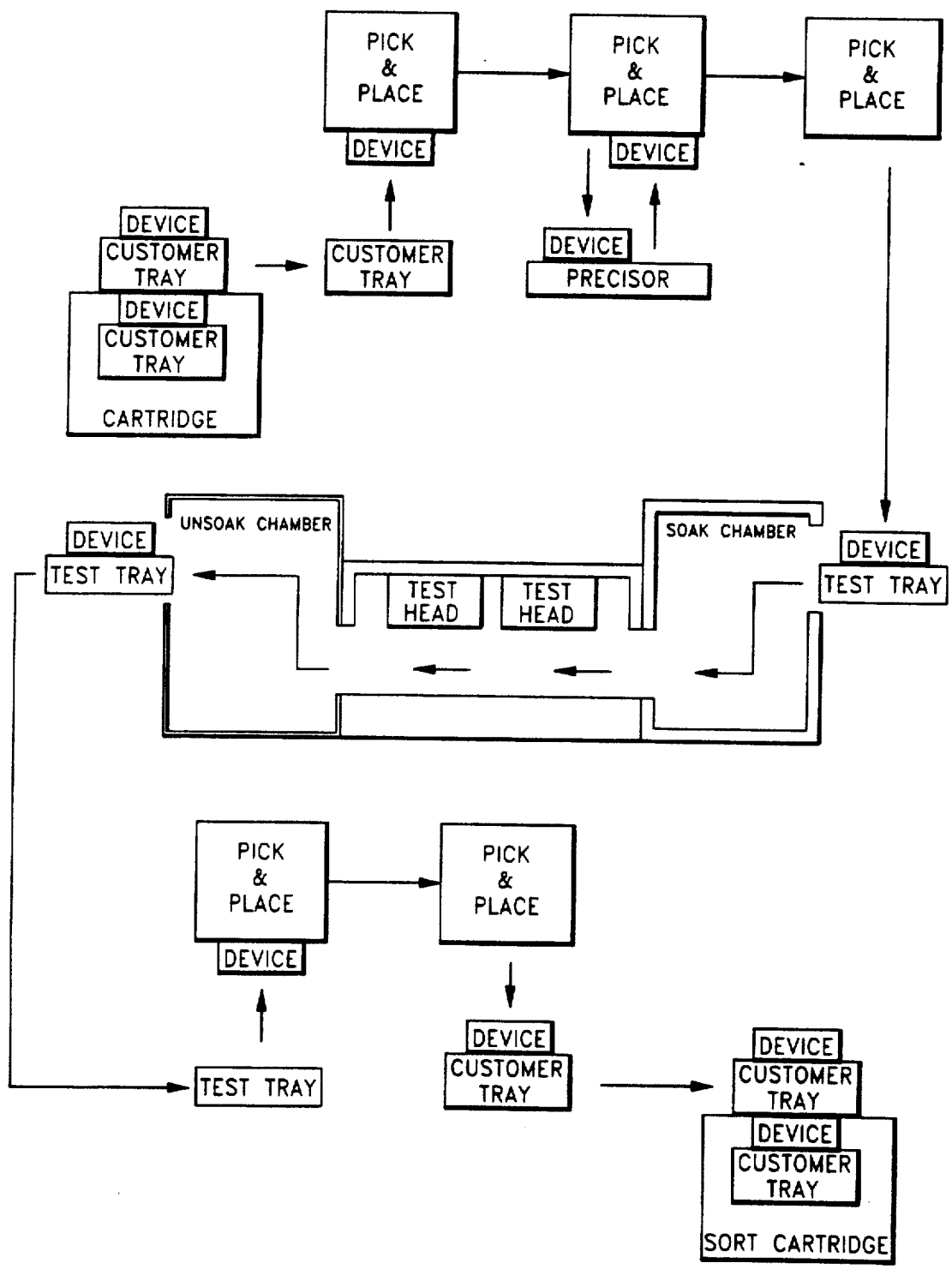
FIG. 3 is a flow diagram for explaining a total test process of an electronic device in accordance with the automatic test bandler of FIGS. 1 and 2.

FIG. 3 summarizes the overall procedure of testing the IC devices in accordance with the automatic test handler 20 of FIG. 1, and is a useful reference in connection primarily with FIG. 1, for the following description.

The loader 26 is comprised of one or more customer tray magazines 40, a loader catcher 48, a buffer 50, loader stages 52a, 52b, and a transfer arm 54. A customer tray 42 is a tray carrying a plurality of IC devices on it for delivery of the IC devices to a user of the IC devices. The customer tray 42 differs in its shape, size, and number of IC devices to be carried from IC manufacturer to manufacturer. The customer trays 42 with IC devices to be tested are installed in the customer tray magazines 40, the maximum number of which is typically twenty-four trays for each magazine.

Loader elevator 56 positioned underneath of the customer tray magazines 40a and 40b (not shown but next to 40a), push the customer trays 42 to the top of the customer tray magazines one by one. The loader catcher 48 descends and picks up the top customer tray 42. The loader catcher 48 goes up to the original position and then moves horizontally until a position right over the buffer 50. The customer tray is unloaded from the loader catcher 48 to the buffer 50. The loader catcher 48 goes back to the original position to catch the next customer tray.

The transfer arm 54 shown in the middle of FIG. 1 can move in both horizontal and vertical directions. The transfer arm 54 receives the customer tray 42 on the buffer 50 and transfers the customer trays 42 to a loader stage 52. Thus, as illustrated in FIG. 1, the customer tray 42 is set on the loader stage 52b. In the actual system, preferably, two customer trays 42a and 42b are respectively set on the loader stages 52a and 52b to be ready for the next sequence of the test handler 20.

The load pick and place 28 can move freely in a horizontal plane upon sensing the positions of the electronic devices, the customer trays 42, and a test tray 24. The load pick and place 28 picks one or more of the electronic devices to be tested from the customer trays 42a and 42b and transfers the devices to the test tray 24a. For example, the load pick and place 28 has eight vacuum heads or suction inlets which pick the devices up using a compressed air.

The IC devices 44 (shown in FIG. 5B) are transferred from the customer tray to the test tray because the automatic test handler 20 requires more accurate and precise positioning of the devices to ensure sufficient contact between the device leads and the contactors of the test heads 36a and 36b. Since the primary purpose of the customer tray is to provide the electronic devices to customers in a packed form, the layout of device holding seats are not necessarily accurate. Therefore, preferably, the load pick and place 28 stops over a precisor 58 and drops the electronic devices thus brought from the customer tray 42 into seats 59 on the precisor 58, and then picks up the devices again. The purpose of the precisor 58 is to align and correct the spacing of the electronic devices picked up from the customer trays. The emptied customer trays are transferred to the stages of the unloader 30 for receiving the tested devices depending on the test result.

The test trays 24 includes a plurality of carrier modules 22 (FIGS. 5A and 5B) precisely aligned but still flexibly movable on the frame of the tray, the details of which will be described with respect to FIGS. 5 and 6. Each carrier module 22 is loaded with the electronic device to be tested in a seat by means of the load pick and place 28 as described above. The test trays 24 thus filled with the devices are transferred to the soak chamber 34. As illustrated in the right hand side of FIG. 2 (which is a rear view of the test handler 20 shown in FIG. 1), at the direction of the control module, the test tray 24 is loaded on a top part of a chamber elevator 60 of the soak chamber 34 through a passageway 62.

The test trays are timely and orderly conveyed by the chamber elevator 60 through the soak chamber 34 in which the ambient temperature is selectively elevated above or lowered below the temperature external to the test system to such a degree that, at the conclusion of the passage of the test trays through this chamber, the electronic devices are at a desired testing temperature. At the conclusion of the soak stage, each tray of electronic devices is transferred through a passageway 64 into the test heads 36a and 36b, the environment of the test heads being suitable to maintain the devices at their desired testing temperature.

Figure 4:
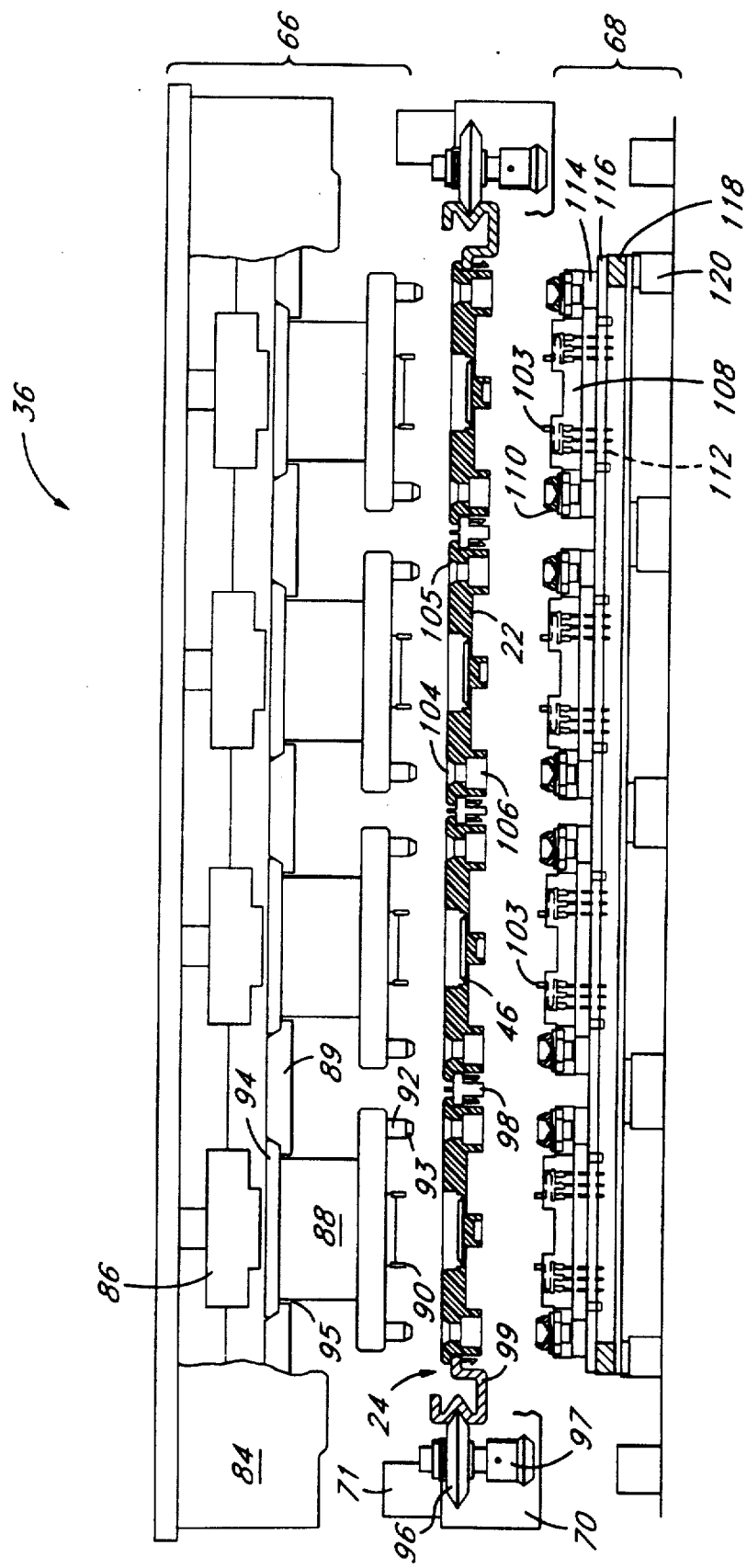
FIG. 4 is a cross sectional view of the contact assembly of the present invention, wherein a vertical drive, a test tray having a number of carrier modules therein and a test fixture are arranged in vertical relationship. Each of the carrier module is provided in its seat with an electronic device, for example, a semiconductor integrated circuit to be tested by the test handler.

The test heads 36a and 36b respectively comprise a vertical drive 66 for driving the test tray 24 downward and a test fixture 68 for providing a test signal to the electronic devices and receiving the resulted signal through test contactors (FIG. 4). The devices 44 are energized, stimulated, and their responses are monitored for test purposes by an IC tester (not shown) which communicates with the devices 44 via the test fixture 68.

At the conclusion of the test, each set of electrical devices is transferred from the test heads 36a and 36b to a chamber elevator 72 at the bottom of the unsoak chamber 38 through a passageway 74. Each of the test trays is gradually conveyed through the unsoak stage via the chamber elevator 72. During this time, they are exposed to an environment in which heat is transferred from or to the devices to the extent that, at the conclusion of this stage, the temperature of said devices is at or near equilibrium with the environment external to the test system.

The test trays 24 are then removed from the unsoak chamber 38 through passageway 76 and placed on the predetermined position on the test handler 20 as shown in FIG. 2. In the example of FIG. 1, two test trays 24b and 24c carrying the tested electronic devices are positioned on the floor of the test handler 20 to be accessed by two sorting pick and place devices 32a and 32b. The sorting pick and place devices 32a and 32b pick up the tested devices and place the devices in the seats of the customer trays 42 on unloader stages 78 depending on the test results. The unloader 30 is comprised of the unloader stages 78, the transfer arm 54 and customer tray sort magazines 80 having elevators 81 therein. Although only two sort magazines 80 are shown in FIG. 1 for the unloader 30, in the actual system, all sorting positions are set with the sort magazines 80 to receive the customer trays 42. The electronic devices are thus classified based on the test results and set in the appropriate customer trays.

Although each of these principal components of the present invention are described in more detail below, several components are also the subject of copending and commonly owned patent applications which are hereby incorporated by reference. For example, the system configuration and method of the automatic test handler is subject to the patent application titled APPARATUS AND METHOD FOR AUTOMATIC TEST HANDLING, Ser. No. 07/803,159, filed Dec. 4, 1991 and the loader/unloader system is subject to the patent application titled LOADER AND UNLOADER FOR TEST HANDLER, Ser. No. 07/803,154, filed Dec. 4, 1991. Furthermore the loader and unloader pick and place mechanisms are the subject of an application titled PICK AND PLACE FOR AUTOMATIC TEST HANDLER, Ser. No. 07/801,875, filed Dec. 3, 1991.

Contact Assembly

The foregoing is a simplified overall operation of the automatic test handler of FIG. 1. The present invention particularly relates to a contact assembly of the test head 36 in the tester of FIG. 1. As seen in detail in FIG. 4, a basic structure of the contact assembly of the test head 36 in accordance with the present invention is shown. The test head 36 is comprised of a vertical drive 66, a fixture 68, and tray guides 70 supporting the test tray 24 therebetween. The test fixture 68 is fixed while the vertical drive 66 descends and as a result, the test tray 24 is driven downward to engage with the test fixture 68. A top of the housing 71 of the tray guide 70 touches housing 84 of the vertical drive 66 when the vertical drive 66 comes down. Any drive mechanism, such as an elevator mechanism or a compressed air membrane can be used for the power source of the vertical drive 66.

The tray guides 70 for the test trays 24 in the test heads 36 are biased by, for example, springs so that the guides can keep the tray 24 at the same height as the passageway 64 when no downward force is given. However, by the force provided by the vertical drive 66, both the test trays 24 and the tray guide 70 are pushed downward until the leads 46 of the devices 44 to be tested can sufficiently contact with the contactor leads of the test fixture 68. While in the test stage, the electrical leads of all the devices are electrically connected to the test fixture 68. The leads of the full set of devices can be contacted simultaneously, or the leads of suitable subsets of the devices can be contacted simultaneously in steps, depending on the capacity of the test heads 36a,b.

Further in reference to FIG. 4, the vertical drive 66 comprises a housing 84, an individual drive 86, a pusher 88, a pusher support 89, a lead pusher 90 and a pusher guide 92. The pusher 88 is engaged with the housing 84 at a tapered head 94 by gravity when the vertical drive 66 is at rest. However, since the pusher 88 is not mechanically fixed to the housing 84, and there is a small space 95 between the pusher body and the pusher support 89, it is considerably movable in the vertical direction (floating) and slightly movable in the horizontal direction. The pusher guide 92 includes a tapered portion 93 at the bottom for accurate positioning and smooth insertion with respect to the carrier module 22 on the test tray 24. The end of the individual drive 86 restricts the upward floating of the pusher 88. The lead pusher 90 is made of an electrically insulating material, preferably sapphire, so that it can directly touch and push the leads 46 of the device 44 under test into contact with a test contactor 103 of the test fixture 68.

As will be described in more detail with respect to FIGS. 12A and 12B, at the final stage of the completion of the contact between the device to be tested and the test contactor, the individual drive 86 further pushes down the pusher 88 independently of the movement of the vertical drive 66. The individual drive 86 includes a membrane 138 (best shown in FIGS. 7A and 12A) which drives the carrier module 22 further down by a power caused by a compressed air. The individual drive 86 operates at the final stage of the contact procedure between the device to be tested and the test contactor for further pushing down the pusher 88 independently from the movement of the vertical drive 66 as will be described referring to FIG. 12A. Various other means for driving the pusher 88, and thus the carrier module, downward are possible for a person skilled in the art.

In FIG. 4, the sets of electronic devices 44 are transported throughout the automatic test handler 20 in the test tray 24, on which the devices are coordinated and arranged co-planarly in the seats of the carrier modules 22 such that the electrical leads of all devices 44 are accessible from at least one common planar side of the tray. The carrier module 22 includes an upper guide hole 104 and a lower guide hole 106 for positioning the pusher 88 and the test contactor 103. The detail of the carrier module 22 is illustrated in FIGS. 5A and 5B. The tray guides 70 include tapered rotors 96 which engage an indent of a side frame 99 of the test tray 24. A plurality of the tapered rotors 96 are employed to support both sides of the frame of the test tray 24 as shown in FIG. 6. Thus, the test tray 24 is planarly supported by the guides 70 and, at the same time, transferred to the next stage of the test handler 20 by rotation of the rotors 96 when the test is completed. A base 97 supports the rotors 96 and provides a rotational force from a drive source (not shown) to the rotors 96 for moving the test trays 24.

Further referring to FIG. 4, the test fixture 68 comprises a test contactor 103, a test socket 108, a socket guide 11, connection leads 112, a sub-socket board 114, a socket board 116, a spacer 118 and a base 120. The test contactor 103 is comprised of a plurality of conductive pins in parallel as shown in FIGS. 7-12 in detail. The spacing of the conductive pins in the contactor 103 is identical to the spacing of the leads of the IC device to be tested. The connection leads 112 transmit electronic signals to and from the IC device under test to an interface electrical circuit on the socket board 116 for electrical connection with an IC Tester (not shown) which generates test signals for the IC devices. The socket guide 110 defines the position of the carrier module 22 by inserting into the guide hole 106.

FIG. 5A shows a perspective view of an example of a carrier module 22 for placing an IC device in its seat for testing the IC in accordance with the present invention. The carrier module 22 is made, for example, by plastic mold process and is formed in symmetrical manner with respect to the center. The carrier module includes a seat 100 at the center of the body, upper guide holes 104 having tapered inlets 105, slits 102, lower guide holes 106, stopper nails 126 and aligning ends 128. In this example, in each seat 100 of the carrier module 22, an IC device to be tested is seated with its electric leads 46 on the floor of the seat. On the floor of the seat 100, there is provided a plurality of slits 102 corresponding to the leads 46 of the device 44 so that the test contactor 103 in the test fixture 68 can enter therethrough to contact with the device leads.

Thus, in FIG. 5A, the portion of the leads 46 are inserted in the slits 102. The positional relationship between the leads 46, the slits 102 and the test contactor 103 will be described in detail later with respect to FIGS. 7-12. In the seat of the carrier module 22, a pair of steps 130 are preferably provided for determining the position of IC device 44 to be tested when the IC devices 44 are dropped by the load pick and place 28 from the customer tray to the test tray 24 as described above.

FIG. 5B is a cross sectional view of the carrier module of the FIG. 5A taken along the line A—A including an IC device to be tested. The IC package in FIG. 5B is one of the newest type of IC packages and is called a TSOP (Thin Small Outline Package). The characteristics of the TSOP is that it has electric leads at the longitudinal ends of the package and the overall height is under 1.27 millimeter and the spacing between the leads is under 0.8 millimeter and the lead width is under 0.4 millimeter. Because the lead spacing and the lead width are very small, the slits 102 are provided in the carrier module 22 for securing the electrical separation among the leads 46.

The test trays 24 support a plurality of carrier modules 22 aligned in rows and columns. The outer shape of each carrier module 22 is precisely identical with the others so that the position of the test fixture 68 with respect to the test tray 24 can be precisely defined. Instead of having modules with a precise outer shape, however, it is also possible to utilize other positioning means, for example, a framework arranged in rows and columns including contact means to attach carrier modules. In the example of FIG. 6, a plurality of carrier modules 22 are aligned in each position of the test tray 24 defined by the frame 98.

FIG. 6 is a plan view of one of the examples of the test tray 24 and the tray guide 70 in accordance with the present invention. The test tray 24 is guided by the tray guide 70 to maintain the horizontal plane. The tray guide 70 includes a plurality of rotors 96 which engage with indents on both side frames 99 of the test tray 24. Thus the test tray 24 is planarly supported by the rotors 96 and, at the beginning and the ending of the test of the devices, transferred to the next stage of the test handler by rotation of the rotors 96.

Although only three carrier modules 22 are assembled on the test tray 24 as a convenience of explanation, in an actual device a full number of carrier modules, for example sixty-four, are installed on the test tray 24. The test tray 24 has frames 98 and side frames 99 both of which have windows 132 wherein the stopper nails 126 of the carrier module 22 as seen in FIG. 5A are inserted. The adjacent windows 132 on the frames constitute indents 134 wherein the aligning ends 128 of the carrier module shown in FIG. 5A are engaged. Since the stopper nail 126 is flexible because it is thin and is made of plastic materials, it is easily inserted in the window 132.

Once the stopper nail 126 is inserted in the window 132, it works as a stopper preventing the carrier module 22 from going upward over the predetermined distance. Thus, the carrier module 22 can significantly move in upward direction (floating) over the test tray 24 until it is restricted by the stopper nails 126. The carrier module 22 also can flexibly move in a horizontal plane on the test tray 24 because the indent 134 is designed wider than the aligning ends of the carrier module 22 and there is a small gap 156 therebetween. The reason for having floating capability in both vertical and horizontal direction in the assembly of the carrier module on the test tray 24 is to secure flexibility for positioning when the carrier module contacts with the test socket 108, which will be described in more detail with respect to FIGS. 7-12.

The carrier module 22 is arranged on the test tray 24 at the position defined by the frame 98. However, similar to the pusher 88 the carrier module 22 can significantly move in an upward direction (floating) and also slightly move move in a horizontal direction. Also referring to FIG. 4, the guide hole 104 invites the guide 92 on the pusher 88 through a tapered inlet 105 at the top of the hole 104. Thus, the positional relationship between the pusher 88 and the carrier module 22 is determined by pusher guide 92 and the guide hole 104. The diameters of the guide holes 104 and 106 are preferably selected to be different from so that the ends of the guide holes work as a stopper for the guide 92 in the pusher 88 and the socket guide 110 in the test fixture 68. The guide hole 106 is used for accurately positioning the carrier module 22 with respect to the test contactor 103 on the test fixture 68, as will be described below.

Figure 7A:
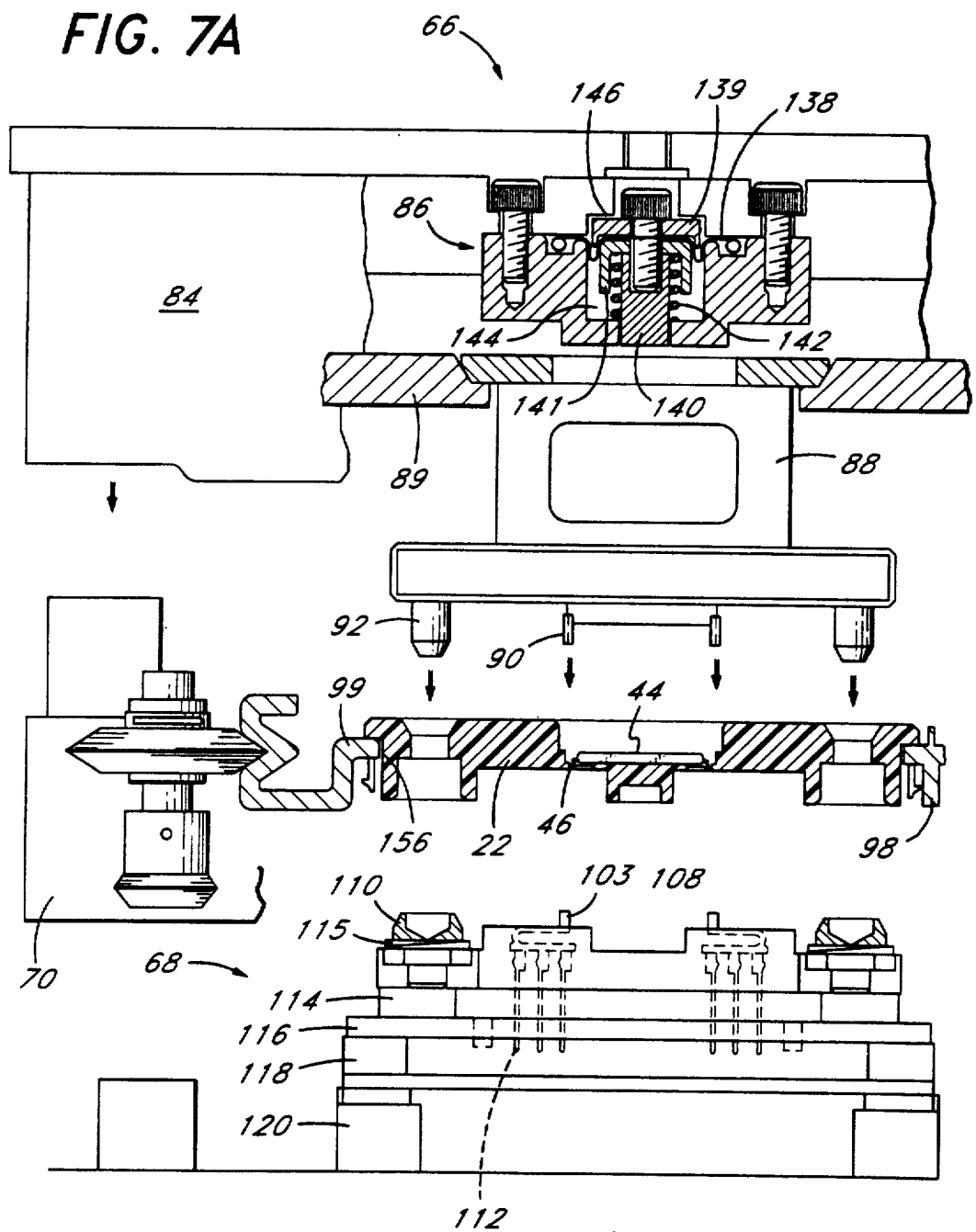
FIG. 7A is a partial sectional view of the contact assembly of the present invention showing the detailed structure of the vertical drive, the test tray and carrier module and the contactor in the test fixture.

FIG. 7A is a cross sectional view showing the detailed structure of the preferred embodiment of the contact assembly in accordance with the present invention. In FIG. 7A, only one set of a pusher 88, a carrier module 22 and a test socket 108 is shown for simplicity explanation, however, in an actual system, a large number of the sets, for example, sixty-four sets of such combination are aligned in row and column as illustrated in FIG. 6 as an example of the test tray.

As has been described with respect to FIG. 4, and more clearly seen in FIG. 7A, the vertical drive 66 comprises the housing 84, the individual drive 86, the pusher 88, the pusher support 89, the lead pusher 90 and the pusher guide 92. The individual drive 86 comprises a membrane 138, a piston 140, a piston support 141, a spring 142, and a membrane support 139 in a room 144. A ceiling 146 of the room 144 is air-tightly sealed so that when a compressed air is provided between membrane 138 and the ceiling 146 the membrane 138 deforms and pushes down the piston 140 through the piston support 141 as shown in FIG. 12A.

The test fixture 68 comprises, as briefly described in FIG. 4, the test contactor 103, the test socket 108, the socket guide 110, connection leads 112, the sub-socket board 114, the socket board 116, the spacer 118 and the base 120. The test contactor 103 is comprised of a plurality of parallel conductive pins the spacing of which is identical to that of the leads 46 of the IC device 44 to be tested. The test contactor 103 and the connection leads 112 are, preferably, integrally formed by an electrically conductive material. The connection leads 112 transmit electronic signals to and from the IC device under test to an interface electrical circuit on the socket board 116 for electrical connection with an IC Tester (not shown) which generates test signals for the IC devices. The socket guide 110 defines the position of the carrier module 22 by inserting into the guide hole 106. At the lower portion of the socket guide 110, there is provided a spring 115 to react to the weight of the pusher 88 and the carrier module 22 which will be described later with respect to FIGS. 9 and 10. The sub-socket board 114 for supporting the test socket 108, the spacer 118 for obtaining a certain space for the electronic circuitry on the socket board 116 and the base 120 for supporting the socket board 116, spacer 118, etc., are used, if necessary, depending on the structure of the test fixture 68. At the floor of the test handler 20, a level adjuster 153 is provided to function as a stopper for the downward movement of the vertical drive 66 and the tray guide 70. Thus, the level adjuster 153 is adjusted to determine the final positional relationship of the contactor assembly of the present invention for the complete electrical contact between the device leads 46 and the test contactor 103.

Figure 7B:
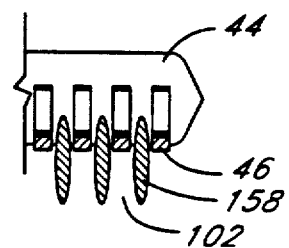
FIG. 7B is a cross sectional view showing the positional relationship between the device leads and the slits in the carrie module taken along the line A—A in FIG. 5B.

FIG. 7B is a cross sectional view showing the positional relationship, at the state of FIG. 7A between the leads 46 of the electronic device 44 in the seat of the carrier module 22 and the slits 102 at the floor of the carrier module 22 taken along the line A-A in FIG. 5B. In this example, the newest type of IC package called TSOP as describe above with respect to FIG. 5B is illustrated. When at rest, i.e., the state where the IC device is simply placed in the seat of the carrier module 22, each of the leads 46 is inserted into the corresponding slit 102 so that the leads are electrically isolated from each other by a comb 158. As seen in FIG. 7B, the leads 46 of the IC device 44 are positioned at about the center of the slits 102, for example, 0.2 millimeter from the top of the comb 158. The vertical length of the comb 158 in this example is about 0.8 millimeter.

FIGS. 8-12 are cross sectional views corresponding to the view in FIG. 7A for showing the contact procedure of the device leads 46 and the test contactor 103 in accordance with the present invention. FIG. 8A shows the state, by further descent of the vertical drive 66 from the state illustrated in FIG. 7A (at rest), where the guides 92 of the pusher 88 are inserted in the guide holes 104 of the carrier module 22. This insertion can be done smoothly because of the tapered shape both at the ends of the guides 92 and the guide holes 104. Further, as describe above, since both the pusher 88 and the carrier module 22 are horizontally movable because of the space 95 at the side of the pusher and the gap 156 at the side of the carrier module 22, adjustment of the position between the two will be easily accomplished. The insertion of the pusher into the carrier module has been done only by the weight of the pusher 88. At this stage, there is a gap between the bottom of the housing 84 of the vertical drive 66 and the top of the tray guide 70 and thus the pusher is still engaging with the pusher support 89. Since the test tray guide 70 and thus the test tray 24 are biased by for example a spring (not shown) the force of which is sufficiently greater than the gravity of the pusher 88, there is no change in the vertical position of the test tray 24.

Figure 8A:
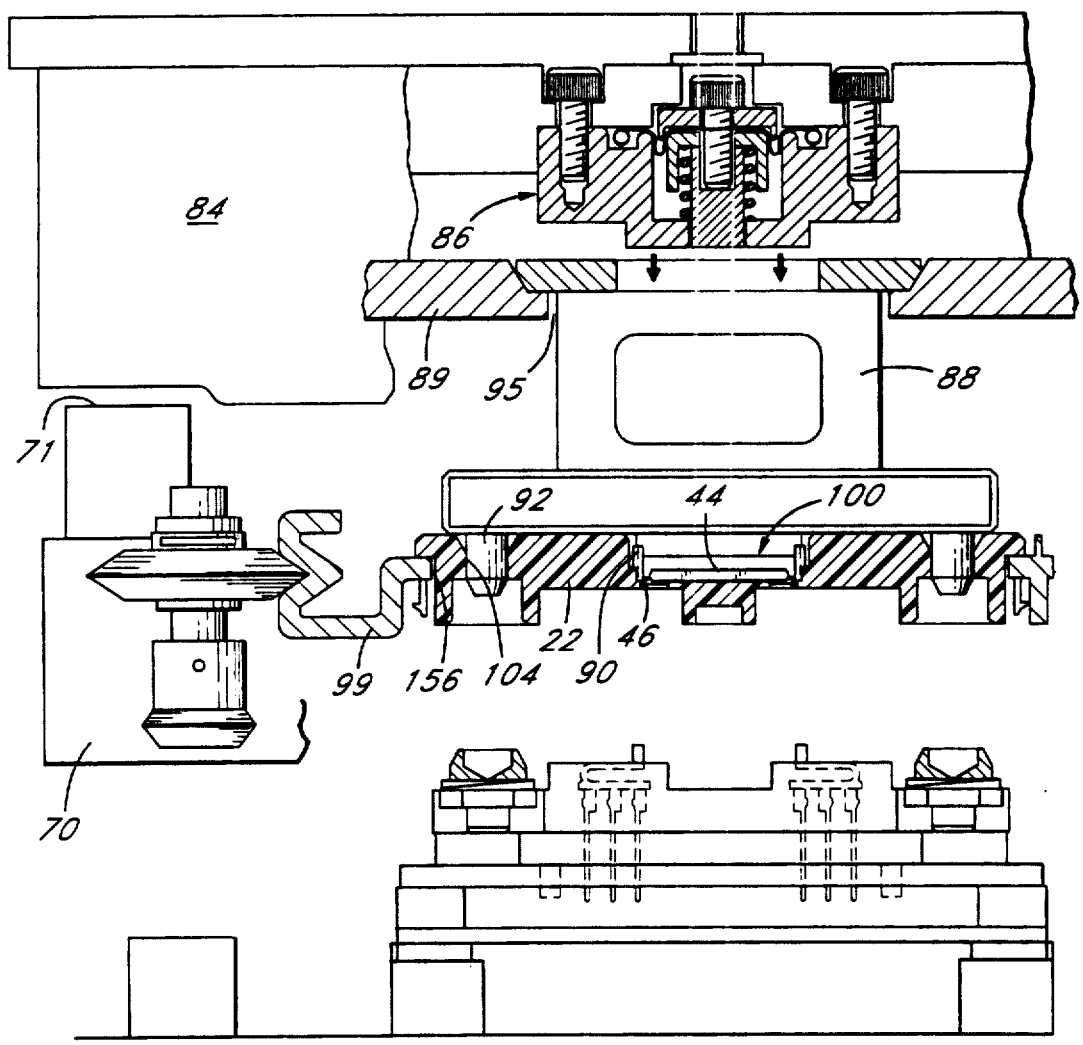
FIG. 8A is a partial sectional view of the contact assembly of the present invention showing the process of the contact mechanism, wherein a pusher of the vertical drive engages with the carrier module.
Figure 8B:
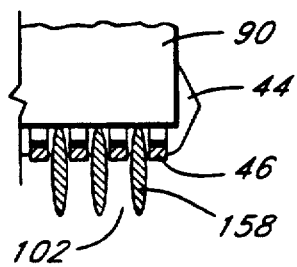
FIG. 8B is a cross sectional view showing the positional relationship between the device leads, the slits in the carrier module and the lead pusher at the state of FIG. 8A take along the line A—A in FIG. 5B.

FIG. 8B is a cross sectional view showing the positional relationship between the device leads 46, 103, the slits 102 and the lead pusher 90 at the state of FIG. 8A. As seen in the drawing, the vertical position of the device leads 46 with respect to the slits 102 and thus the comb 158 is the same as that of FIG. 7B. However, the lead pusher 90 on the pusher 88 is inserted in the seat 100 of the carrier module 22 and, as a result, the lead pusher 90 lightly touches the top of the comb 158 but does not contact with the end portion of the device leads 46 where the test contactor 103 contacts at the final stage of the contact procedure.

FIG. 9 shows the moment where the housing 84 of the vertical drive 66 begins to contact with the top face 71 of the tray guide 70. By the bias force as above in the tray guide 70 and the test tray 24, which is sufficiently greater than the weight of the pusher 88, the pusher cannot force the test tray down by the further downward movement of the vertical drive 66 from the state of FIG. 8A but instead floats over the pusher support 89. Therefore, the tapered head 94 of the pusher 88 no longer engages with the tapered edge 150 of the pusher support 89. Thus, the combination of the pusher 88 add the carrier module has now became flexible and ready to adjust the position with respect to the test contactor 103 in the test fixture 68. As the same way in FIG. 8A, the carrier module 22 receives the gravity of the pusher 88 through the lead pusher 90 and the pusher body which touches the frame of the carrier module 22. The positional relationship between the device leads 46, the slits 102, the comb 158 and the lead pusher 90 remains the same as that of FIG. 8B.

Figure 10B:
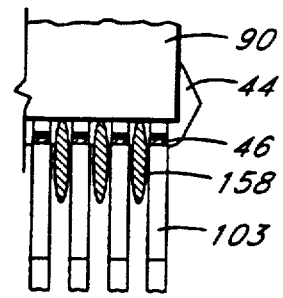
FIG. 10B is a cross sectional view showing the positional relationship between the device leads, the slits in the carrier module, the lead pusher and the test contactor at the state of FIG. 10A taken along line A—A of FIG. 5B.
Figure 10A:
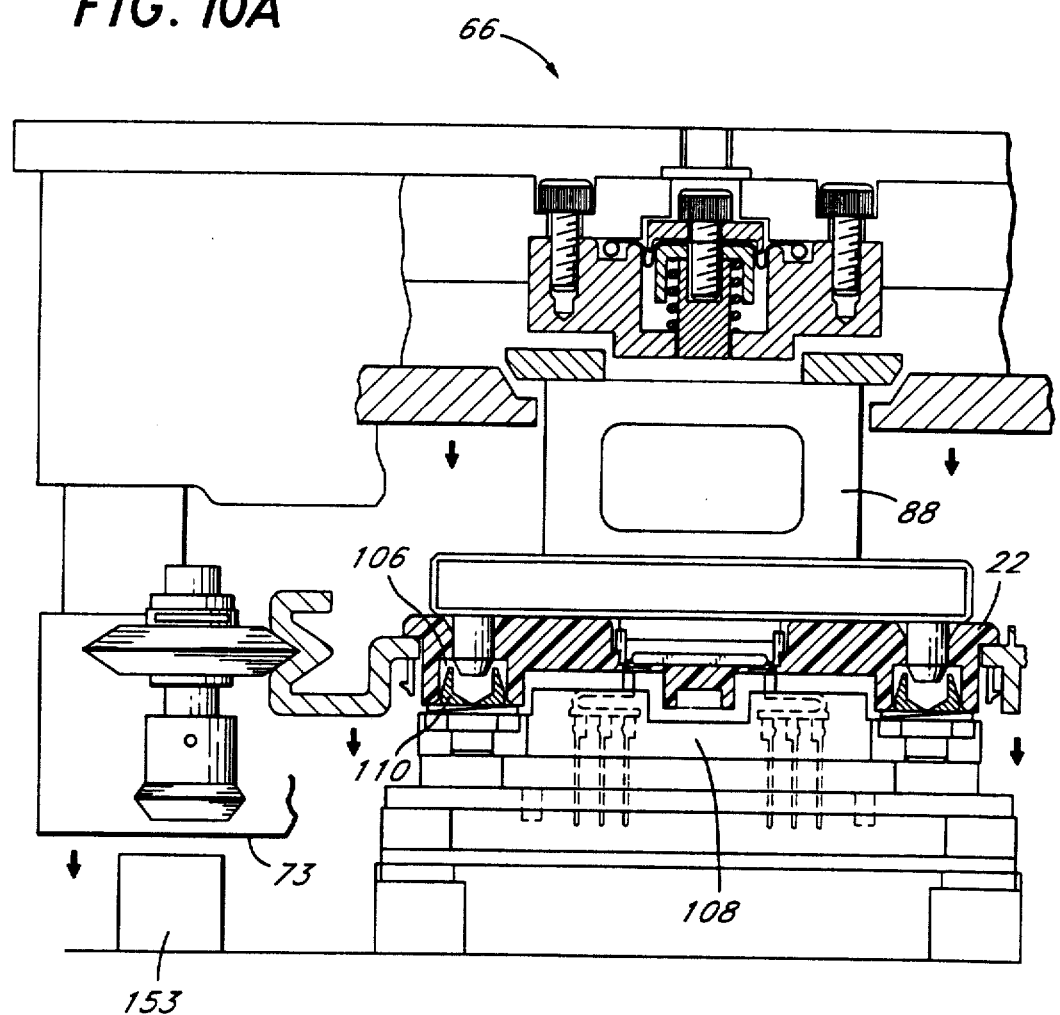
FIG. 10A is a partial sectional view of the contact assembly of the present invention showing the process of the contact mechanism, wherein the carrier module starts to contact to the contactor leads of the test fixture by the further vertical advancement of the vertical drive from that of FIG. 9.

FIG. 10A shows a state where the combination of the pusher 88 and the carrier module 22 is engaged with the test socket 108 by the insertion of the socket guide 110 into the lower guide hole 106 of the carrier module 22. Since the carrier module 22 was in floating state with the combination of the pusher 88 as in FIG. 9, the positioning for the test socket 108 is easily accomplished by the taper portions of the socket guide 110 and the lower guide hole 106. A bottom 73 of the tray guide 70 is not reached to the level adjuster 153. In this state, the insertion of the socket 110 into the carrier module 22 is made by the weight of the pusher 88 and the carrier module 22. Therefore, as shown in FIG. 10B, the test contactor 103 lightly touches the device leads 46 which is not sufficient contact for electronic communication from the test signal to the device 44.

FIG. 11 shows a state where the downward movement of the vertical drive 66 is stopped by the level adjuster 153. Since the spring force at the spring 115 is greater than the gravity of the combination of the carrier module 22 and the pusher 88, the carrier module and the pusher 88 slightly ascend from the state of FIG. 10A and cause a gap 155 between the carrier module 22 and the frame 99 of the test tray 24. This redundancy in the vertical direction is important in compensating the variance of the distance from the test contactor 103 and to the corresponding device 44 to be tested caused by a deformation or curvature in the test tray or the tray guide or the like. In FIG. 11, the relationship between the device leads 46, the lead pusher 90, the combs 158 and the test contactor 103 remains the same as that shown in FIG. 10B.

FIG. 12A shows a final stage of the contact process in accordance with the present invention. After the vertical drive stopped its downward movement by the level adjuster 153, the individual drive 86 further drives down the carrier module 22 to achieve sufficient electric contact in the device leads 44 and the test contactor 103. Namely, a compressed air is provided between membrane 138 and the ceiling 146, and as a result, the membrane 138 deforms and pushes the piston 140 through the piston support 141. The force of the spring 115 is now overcome by the individual drive 86 and the socket 108 is allowed further insertion in the carrier module 22 as illustrated in FIG. 12A. By the reaction of the test contactor 103, the end portion of the device leads 46 will be raised until restricted by the lead pusher 90. Therefore, as shown in FIG. 12B, the device leads 46 contact with the test contactor 103 in the increased contact pressure, which is ideal for perfect electrical contact for testing the device 44. In FIG. 12B, the end portion of the device leads 46 is positioned at the top of the combs 158 pressed both by the lead pusher 90 and the test contactor 103.

As has been foregoing, the contact assembly for an automatic test handler in accordance with the present invention comprises a vertical drive having a pusher arrangement for pushing the carrier module downward, a test tray having one or more IC carrier modules which can securely retain chips of various configurations, and a test contactor for supplying and receiving test signals. The contact assembly of the present invention can efficiently make electrical contact between the test contactors in the test fixture and the leads of modern IC's by utilizing a pusher assembly and a carrier module both of which are flexibly aligned to be "floating" for easy positioning each other.

The contact assembly of the present invention is also provided, in the vertical drive, with a plurality of individual drives corresponding to each of the carrier modules for independently pushing the carrier module so that the device in the carrier module can perfectly contact with the contactor leads. Since the individual device overcomes the fluctuations of spacing between the leads of the device and the contactor due to the curvature of the tray or the degradation of flatness of the test fixture by independently provides additional stroke to the carrier.

Although the invention has been described in terms of the preferred embodiment, other embodiments that are apparent to those of ordinary skill in the art are also within the scope of the invention. Accordingly, the scope of the invention is intended to be defined only by reference to the appended claims.

What is claimed is:

1. A contact assembly for use in an automatic test handler in connection with an electronic device test system having a test signal generator and a signal comparator, comprising:

a test fixture having a plurality of test contactors corresponding to electric devices to be tested, said test contactors contact with leads of said electronic device under test, and said test contactors provide said electronic device under test stimulus test signals from said test signal generator and receive the resulted signals from said electronic device to said signal comparator;

a vertical drive having a plurality of pushers and individual drives corresponding to said electronic devices to be tested, said vertical drive moves in a vertical direction to carry said electric devices in proximity with said test contactors, said individual drives move independently from said vertical drive to provide further vertical movement to said electronic devices through said pushers at the final state of said contact with said test contactor;

a test tray having a plurality of carrier modules for carrying said electronic devices to be tested to a corresponding test position between said test fixtures and said vertical drive, wherein each of said carrier modules has seats for setting said electric devices to be tested therein.

2. A contact assembly as defined in claim 1, wherein said test tray comprises a plurality of frames on which said carrier modules are flexibly aligned so that said carrier modules float over the frame in the process of said contact for easy positioning with respect to said pusher and said test contactor.

3. A contact assembly as defined in claim 1 wherein each of said pushers includes at least one lead pusher for giving the leads of said electric devices to be tested a pressure to sufficiently contact with said test contractor.

4. A contact assembly as defined in claim 3, wherein said lead pusher is made of sapphire.

5. A contact assembly as defined in claim 1, wherein each of said pushers is supported on said vertical drive so that said pusher is movable with respect to said vertical drive within a limited range for allowing an easy positioning with respect to said carrier module.

6. A contact assembly as defined in claim 1, wherein said individual drive includes a membrane and a piston, said membrane deforms by a force derived from a compressed air for providing a downward moment to said piston to further press said carrier module at the final stage of said contact.

7. A contact assembly as defined in claim 1, wherein each of said pushers on said vertical drive first contacts with said carrier module on said test tray and then the combination of said pusher and said carrier module contact with said test contactor, said combination of said pusher and said carrier module are movable with respect to said test tray for easy positioning with said test contactor.

8. A contact assembly as defined in claim 1 wherein each of said carrier modules includes a plurality of slits defined by a comb for separating said device leads and inviting said test contactor therein.

9. A method of electrically contacting an electronic device leads with test contactors in a contact assembly for testing said electronic devices by an automatic test handler by providing test signals, comprising:

providing a plurality of said test contactors at the bottom of wherein each of said contractor assembly, said test contactors is provided with said test signals for communication with said electric devices under test;

positioning a test tray having a plurality of carrier modules for carrying electronic devices to be tested to a corresponding test position in said electronic device test system, wherein each of said carrier modules has seats for setting said electronic devices to be tested therein;

providing a vertical drive having a plurality of pusher and individual drives corresponding to said electronic devices to be tested, said vertical drive moves in a vertical direction to carry said electric devices into proximity with said test contactors, said individual drive move independently from said vertical drive to provide further vertical movement to said electronic devices through said pushers at the final stage of said contact with said test contactor;

driving said vertical drive downward so that the contact between each of said pushers and each of said carriers modules and each of said test contactors occurs by the following sequence:

a. each of said pushers floats at the beginning of a contact with each of said carrier modules for positioning;

b. a combination of each of said pushers and each of said carrier modules floats over said frame of said test tray;

c. said combination of each of said pushers and each of said carrier modules contact each other;

d. said vertical drive slightly further moves downward and stops;

providing an additional downward movement to each of said carrier modules by each of said individual drives.

* * * * *

UNITED STATES PATENT AND TRADEMARK OFFICE
CERTIFICATE OF CORRECTION

PATENT NO. : 5,227,717
DATED : July 13, 1993
INVENTOR(S) : Kazuyuki Tsurishima, et al.

It is certified that error appears in the above-indentified patent and that said Letters Patent is hereby corrected as shown below:

Column 15/line 4, delete "drive", and insert --drives--.

Signed and Sealed this

Twenty-second Day of October, 1996

Attest:

BRUCE LEHMAN

Attesting Officer

Commissioner of Patents and Trademarks